US009266170B2

(12) United States Patent
Godfrey et al.

(10) Patent No.: US 9,266,170 B2
(45) Date of Patent: Feb. 23, 2016

(54) MULTI-MATERIAL TURBINE COMPONENTS

(75) Inventors: Donald G. Godfrey, Phoenix, AZ (US);
Mark C. Morris, Phoenix, AZ (US);
Mamballykalathil Menon, Gilbert, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 855 days.

(21) Appl. No.: 13/360,126

(22) Filed: Jan. 27, 2012

(65) Prior Publication Data

US 2013/0195673 A1    Aug. 1, 2013

(51) Int. Cl.
| *B22F 7/06* | (2006.01) |
| *B22F 3/105* | (2006.01) |
| *B22F 5/00* | (2006.01) |
| *B22F 5/04* | (2006.01) |
| *C30B 11/00* | (2006.01) |
| *B23P 15/04* | (2006.01) |
| *C30B 29/52* | (2006.01) |

(52) U.S. Cl.
CPC ............... *B22F 3/1055* (2013.01); *B22F 5/009* (2013.01); *B22F 5/04* (2013.01); *B22F 7/06* (2013.01); *B23P 15/04* (2013.01); *C30B 11/00* (2013.01); *C30B 29/52* (2013.01); *Y10T 29/49336* (2015.01)

(58) Field of Classification Search
CPC ............................. B22F 3/1055; B22F 5/009
USPC ............................................................ 419/8
See application file for complete search history.

(56) References Cited

U.S. PATENT DOCUMENTS

| 4,145,481 A | 3/1979 | Gupta et al. |
| 4,198,442 A | 4/1980 | Gupta et al. |
| 4,382,976 A | 5/1983 | Restall |
| RE31,339 E | 8/1983 | Dardi et al. |
| 4,499,048 A | 2/1985 | Hanejko |
| 4,687,678 A | 8/1987 | Lindblom |
| 4,818,562 A | 4/1989 | Arcella et al. |
| 5,096,518 A | 3/1992 | Fujikawa et al. |
| 5,106,266 A | 4/1992 | Borns et al. |
| 5,128,179 A | 7/1992 | Baldi |
| 5,236,116 A | 8/1993 | Solanki et al. |
| 5,249,785 A | 10/1993 | Nelson et al. |
| 5,465,780 A | 11/1995 | Muntner et al. |

(Continued)

FOREIGN PATENT DOCUMENTS

| DE | 2104062 A1 | 8/1972 |
| DE | 102008056336 A1 | 5/2010 |

(Continued)

OTHER PUBLICATIONS

Szuromi, et al.; Methods for Manufacturing Components from Articles Formed by Additive-Manufacturing Processes, filed with the USPTO on Sep. 16, 2011 and assigned U.S. Appl. No. 13/235,210.

(Continued)

*Primary Examiner* — George Wyszomierski
*Assistant Examiner* — Ngoclan T Mai
(74) *Attorney, Agent, or Firm* — Ingrassia Fisher & Lorenz, P.C.

(57) ABSTRACT

A turbine component for a turbine of an engine is provided. The turbine component includes a blade portion of a first material; and an attachment portion coupled to the blade portion, the attachment portion being a second material.

10 Claims, 4 Drawing Sheets

(56) References Cited

U.S. PATENT DOCUMENTS

| | | | |
|---|---|---|---|
| 5,514,482 A | 5/1996 | Strangman | |
| 5,554,837 A | 9/1996 | Goodwater et al. | |
| 5,634,992 A | 6/1997 | Kelly et al. | |
| 5,640,667 A | 6/1997 | Freitag et al. | |
| 5,650,235 A | 7/1997 | McMordie et al. | |
| 5,745,834 A | 4/1998 | Bampton et al. | |
| 5,837,960 A * | 11/1998 | Lewis et al. | 219/121.63 |
| 5,947,179 A | 9/1999 | Kinane et al. | |
| 6,049,978 A | 4/2000 | Arnold | |
| 6,154,959 A | 12/2000 | Goodwater et al. | |
| 6,172,327 B1 | 1/2001 | Aleshin et al. | |
| 6,174,448 B1 | 1/2001 | Das et al. | |
| 6,269,540 B1 * | 8/2001 | Islam et al. | 29/889.7 |
| 6,270,914 B1 | 8/2001 | Ogasawara et al. | |
| 6,355,116 B1 | 3/2002 | Chen et al. | |
| 6,447,924 B1 | 9/2002 | Bettridge | |
| 6,485,848 B1 | 11/2002 | Wang et al. | |
| 6,504,127 B1 | 1/2003 | McGregor et al. | |
| 6,568,077 B1 | 5/2003 | Hellemann et al. | |
| 6,575,349 B2 | 6/2003 | Van Esch | |
| 6,676,892 B2 | 1/2004 | Das et al. | |
| 6,758,914 B2 | 7/2004 | Kool et al. | |
| 6,838,191 B1 | 1/2005 | Raj | |
| 6,884,461 B2 | 4/2005 | Ackerman et al. | |
| 6,969,457 B2 | 11/2005 | MacDonald et al. | |
| 7,216,428 B2 | 5/2007 | Memmen et al. | |
| 7,270,764 B2 | 9/2007 | Wustman et al. | |
| 7,651,658 B2 | 1/2010 | Aimone et al. | |
| 7,794,800 B2 | 9/2010 | Clark et al. | |
| 7,829,142 B2 | 11/2010 | Kool et al. | |
| 2001/0014403 A1 * | 8/2001 | Brown et al. | 428/539.5 |
| 2003/0037436 A1 | 2/2003 | Ducotey, Jr. et al. | |
| 2003/0088980 A1 | 5/2003 | Arnold | |
| 2003/0217915 A1 | 11/2003 | Quellet et al. | |
| 2004/0009635 A1 | 1/2004 | Nakasato et al. | |
| 2005/0036892 A1 | 2/2005 | Bajan | |
| 2005/0091848 A1 | 5/2005 | Nenov et al. | |
| 2005/0133527 A1 * | 6/2005 | Dullea et al. | 222/1 |
| 2005/0268998 A1 | 12/2005 | Bostanjoglo et al. | |
| 2006/0013820 A1 | 1/2006 | Bonnet et al. | |
| 2006/0177582 A1 | 8/2006 | Chandra et al. | |
| 2006/0222776 A1 | 10/2006 | Madhava et al. | |
| 2007/0000772 A1 | 1/2007 | Ramm et al. | |
| 2007/0084047 A1 | 4/2007 | Lange et al. | |
| 2007/0107202 A1 | 5/2007 | Das | |
| 2008/0014457 A1 | 1/2008 | Gennaro et al. | |
| 2008/0290215 A1 | 11/2008 | Udall et al. | |
| 2008/0304975 A1 | 12/2008 | Clark et al. | |
| 2009/0081066 A1 * | 3/2009 | Illston | 419/8 |
| 2009/0200275 A1 | 8/2009 | Twelves et al. | |
| 2009/0255602 A1 | 10/2009 | McMasters et al. | |
| 2010/0021289 A1 | 1/2010 | Grylls et al. | |
| 2010/0025001 A1 | 2/2010 | Lee et al. | |
| 2010/0028158 A1 | 2/2010 | Richter | |
| 2010/0065142 A1 | 3/2010 | McMasters et al. | |
| 2010/0200189 A1 | 8/2010 | Qi et al. | |
| 2010/0221567 A1 | 9/2010 | Budinger et al. | |
| 2011/0106290 A1 | 5/2011 | Hövel et al. | |
| 2011/0135952 A1 | 6/2011 | Morris et al. | |
| 2011/0311389 A1 | 12/2011 | Ryan et al. | |
| 2012/0003086 A1 | 1/2012 | Morris et al. | |
| 2012/0034101 A1 * | 2/2012 | James et al. | 416/96 R |

FOREIGN PATENT DOCUMENTS

| | | | |
|---|---|---|---|
| EP | 0861919 A2 | 9/1998 | |
| EP | 2045345 A1 | 4/2009 | |
| EP | 2319641 A1 | 5/2011 | |
| GB | 2279667 A | 1/1995 | |
| JP | 5104259 A | 4/1993 | |
| WO | 97/19776 A1 | 6/1997 | |
| WO | 2008034413 A1 | 3/2008 | |
| WO | 2008046387 A1 | 4/2008 | |

OTHER PUBLICATIONS

EP Search Report for Application No. 12 184 142.3 dated Feb. 6, 2013.
Loeber, L., et al.; Comparison of Selective Laser and Electron Beam Melted Titanium Aluminides, published Sep. 24, 2011, pp. 547-556.
Godfrey, D. G. et al.: Titanium Aluminide Components and Methods for Manufacturing the Same from Articles Formed by Consolidation Processes, Filed Aug. 1, 2012 and assigned U.S. Appl. No. 13/564,656.
USPTO Office Action for U.S. Appl. No. 13/041,113; Notification date Apr. 15, 2014.
EP Search Report for Application No. 13 151 337.6 dated May 17, 2013.
Ryan et al.; Methods for Manufacturing Turbine Components, filed with the USPTO on Jun. 22, 2010 and assigned U.S. Appl. No. 12/820,652.
EP Office Action for Application No. 13 151 337.6 dated Jun. 7, 2013.
Hussain et al.; Advanced Nanocomposites for High Temperature Aero-Engine/Turbine Components, Inderscience Publishers, International Journal of Nanomanufacturing; vol. 4, No. 1-4, 2009, pp. 248-256. Retrieved from Internet: <URL:www.inderscience.com>.
Mainier et al.; On the Effect of the Electroless Nickel-Phosphorus Coating Defects on the Performance of This Type of coating in Oilfieled Environments, OnePetro, SPE Advanced Technology Series; vol. 2, No. 1, Mar. 1994.
Bi et al.; Feasibility Study on the Laser Aided Additive Manufacturing of Die Inserts for Liquid Forging, ScienceDirect.
Groth et al.; New Innovations in Diode Laser Cladding, Fraunhofer USA-Center for Surface and Laser Processing.
Clark et al.; Shaped Metal Deposition of a Nickel Alloy for Aero Engine Applications, SciencetDirect.
Electroless Nickel, New Hampshire Materials Laboratory, Inc.
Mittendorf, et al.; Methods for Repairing Turbine Components, U.S. Appl. No. 13/041,113, filed Mar. 4, 2011.
USPTO Office Action, Notification Date Sep. 17, 2014; U.S. Appl. No. 13,564,656.
Kothari, K., et al., "Microstructure and mechanical properties of consolidated gamma titanium aluminides". Powder Metallurgy, 2007, vol. 50, No. 1, pp. 21-27.
Wang, G.-X., et al., "TiAl-based high temperature materials made from extremely deformed elemental powders". Journal de Physique IV, Colloque C7, supplement au Journal de Physique III, vol. 3, Nov. 1993, pp. 469-472.
EP Examination Report for Application No. EP 12157966.8 dated Apr. 28, 2015.
USPTO Notice of Allowance Notification Date Jan. 26, 2015 for U.S. Appl. No. 13/564,656.
Friel, R.J., et al., "Ultrasonic additive manufacturing—A hybrid production process for novel functional products". Procedia CIRP 6 (2013) 35-40.
Gu. D.D., et al., "Laser additive manufacturing of metallic components: materials, processes and mechanisms". International Materials Reviews 2012, vol. 57, No. 3 pp. 133-164.
USPTO Notice of Allowance Notification Date Mar. 6, 2015 for U.S. Appl. No. 13/041,113.
USPTO Office Action Notification Date Mar. 27, 2015 for U.S. Appl. No. 12/820,652.
EP Search Report for Application No. 12157966.8 dated Mar. 17, 2015.

* cited by examiner

MULTI-MATERIAL TURBINE COMPONENTS

TECHNICAL FIELD

The present invention generally relates to turbine engines, and more particularly relates to turbine components and methods for manufacturing turbine components or other components for engines.

BACKGROUND

Gas turbine engines are generally known in the art and used in a wide range of applications, such as propulsion engines and auxiliary power unit engines for aircraft. In a typical configuration, a turbine section of the engine includes turbine components such as rows of stator vanes and rotor blades disposed in an alternating sequence along the axial length of a generally annular hot gas flow path. The rotor blades are mounted on the periphery of rotor disks coupled to a main engine shaft. The stator vanes are coupled to inner and outer endwalls and optimally direct hot combustion gases to the rotor blades, thus resulting in rotary driving of the rotor disks to provide an engine output.

The stator vanes and rotor blades typically have arcuate shapes with generally concave pressure sides and generally convex suction sides extending axially in chords between opposite leading and trailing edges. During operation, the aerodynamic contours of the stator vanes and rotor blades, and corresponding flow passages between, are configured in an attempt to maximize energy extraction from the combustion gases. Since higher engine efficiencies may occur at higher temperatures, some turbine components may additionally include internal cooling passages to enable such high temperature operation.

Given these considerations, turbine components may have relatively complex three-dimensional (3D) geometries that may raise difficult fabrication issues. Conventional fabrication techniques include forging, casting, and/or machining. For example, in one conventional casting process, a ceramic core is assembled into a wax tool that will provide the external shape of the component, the core is encased in wax, a ceramic shell is formed around the wax pattern, and the wax is removed to form a ceramic mold. Molten metal is then poured into the mold, cooled and solidified, and then the external shell and internal core are suitably removed to result in the desired turbine component. The cast turbine component may then undergo subsequent manufacturing processes such as machining, electrical discharge machining (EDM) or laser drilling.

Such prior art methods may be expensive and have long lead-times and low yields. An additional issue with these types of processes is that the resulting component is formed from a single, uniform material. This may require undesirable compromise in material selection with respect to overall properties, cost, and/or processing steps.

Accordingly, it is desirable to provide turbine components and manufacturing methods for turbine components with improved cycle times, reduced costs, and/or improved component performance and durability. Furthermore, other desirable features and characteristics of the present invention will become apparent from the subsequent detailed description of the invention and the appended claims, taken in conjunction with the accompanying drawings and this background of the invention.

BRIEF SUMMARY

In accordance with an exemplary embodiment, a turbine component for a turbine of an engine is provided. The turbine component includes a blade portion of a first material; and an attachment portion coupled to the blade portion, the attachment portion being a second material.

In accordance with another exemplary embodiment, a method is provided for manufacturing an engine component. The method includes providing a first portion of an intermediate component article, the first portion comprising a first material; forming a second portion of the intermediate component article on the first portion of the intermediate component article with an additive manufacturing technique, the second portion comprising a second material; and finishing the intermediate component article to form the engine component

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Broadly, exemplary embodiments discussed herein include turbine components or other components of gas turbine engines and methods for manufacturing such components. The components may be manufactured in sections or portions with materials selected for each portion that optimize the resulting properties. For example, a turbine component may be manufactured with a blade portion of a first material, a tip portion with a second material, and an attachment portion of a third material, with each material being selected based on the individual function of the respective portion. In one exemplary embodiment, one or more of the portions are formed with additive manufacturing techniques such as direct metal laser fusion.

Figure 1:
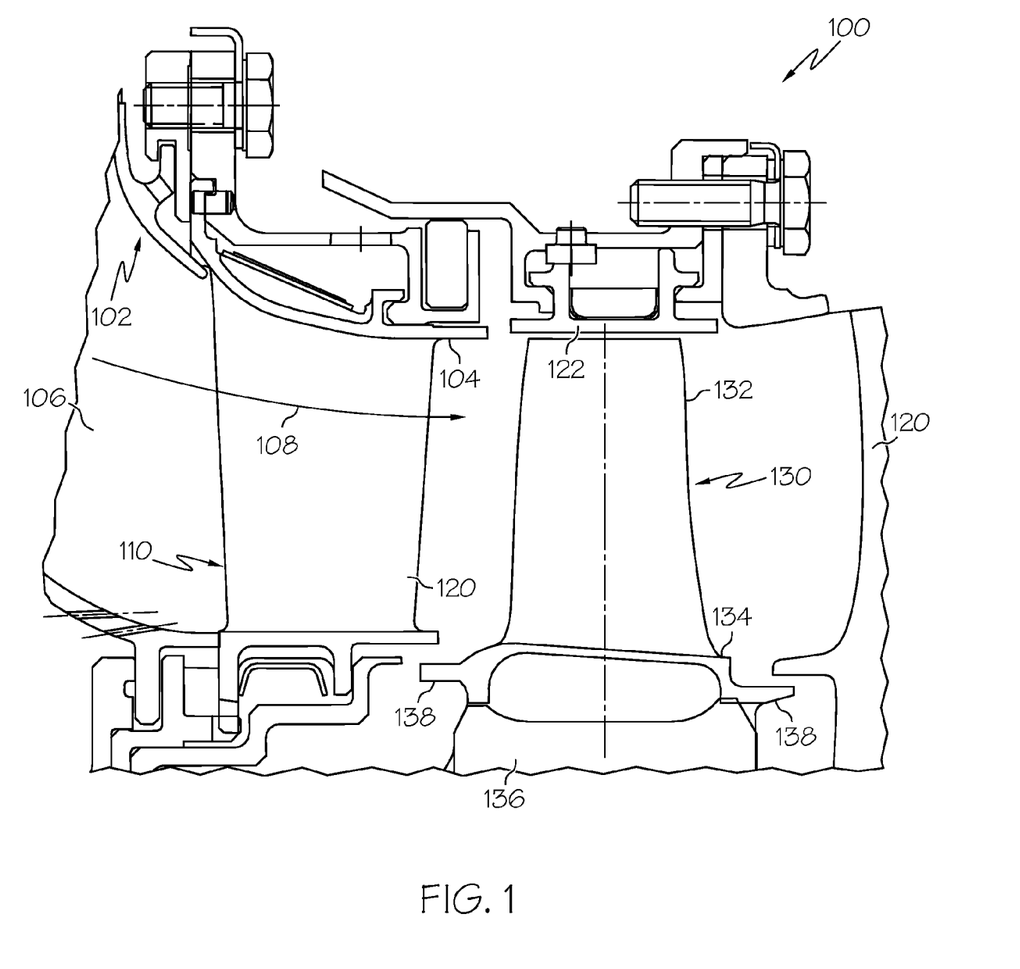
FIG. 1 is a partial cross-sectional view of a turbine section of a gas turbine engine assembly in accordance with an exemplary embodiment.

FIG. 1 is a partial cross-sectional view of a turbine section 100 of a gas turbine engine assembly in accordance with an exemplary embodiment. The turbine section 100 and gas turbine engine assembly have an overall construction and operation that are generally understood by persons skilled in the art. In general terms, the turbine section 100 has a housing 102 with an annular duct wall 104 that defines a mainstream hot gas flow path 106 for receiving a flow of mainstream combustion gases 108 from an engine combustor (not shown). The housing 102 additionally houses at least one stator assembly 110 with stator vanes 120 and at least one turbine rotor assembly 130 with turbine rotor blades (or airfoils) 132. The rotor blades 132 of the turbine rotor assembly 130 project radially outward toward a shroud flange 122 from a turbine rotor platform 134 that is coupled to a turbine disk 136, which in turn circumscribes a shaft (not shown). The rotor platform 134 may include one or more flow discouragers 138 that assist in maintaining efficient air flow along the mainstream hot gas flow path 106.

During operation, the combustion gases 108 flow past axially spaced circumferential rows of stator vanes 120 and rotor blades 132 to drive the rotor blades 132 and the associated turbine rotor assembly 130 for power extraction. Other embodiments may have different configurations.

Figure 2:
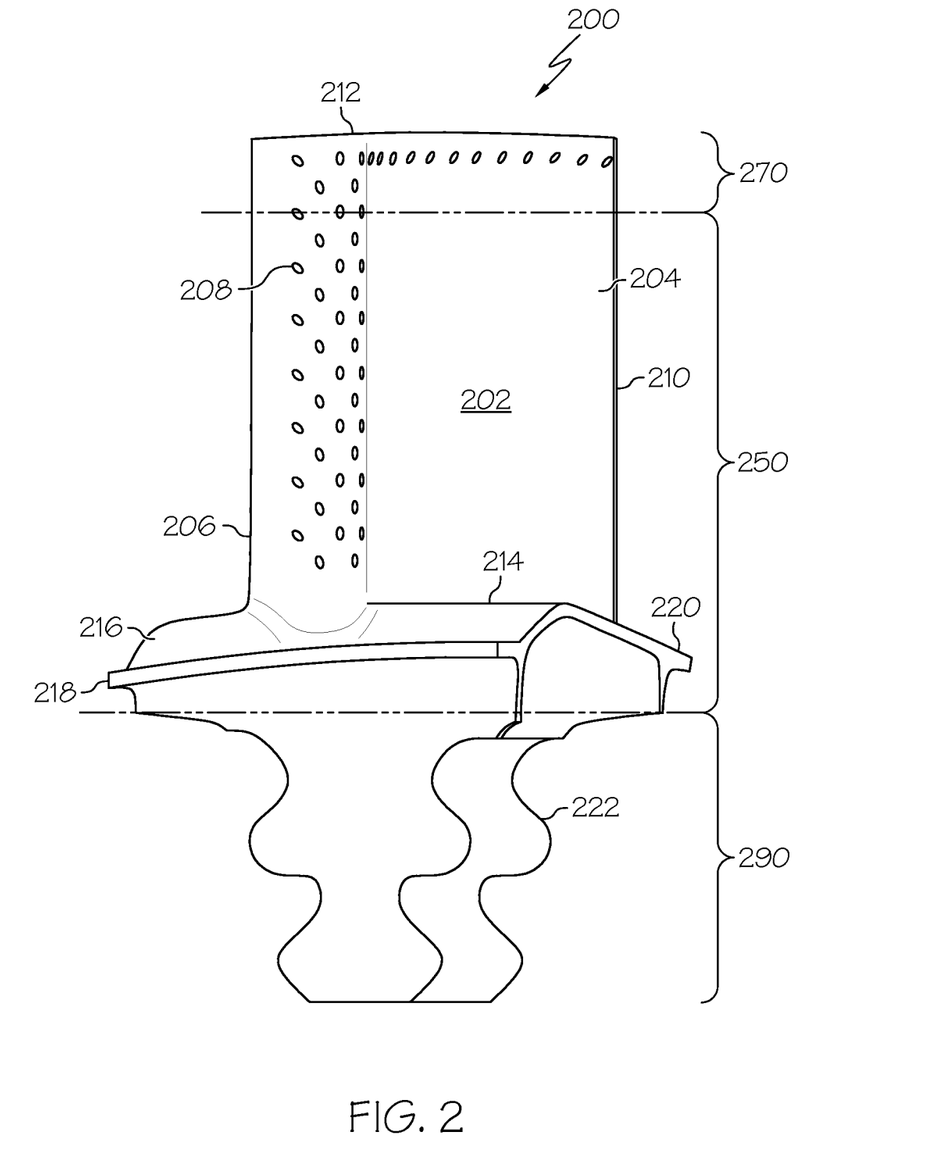
FIG. 2 is an isometric view of a turbine component in accordance with an exemplary embodiment.

FIG. 2 is an isometric view of a turbine component 200 in accordance with an exemplary embodiment and generally illustrates the relatively complex 3D geometric configuration typical of a turbine component, for example, that may be incorporated into the turbine section 100 of FIG. 1. Although the turbine component 200 in FIG. 2 is depicted as a rotor blade, such as rotor blade 132 (FIG. 1), the exemplary embodiments discussed herein are applicable to any type of turbine component, including stator vanes, such as stator vanes 120 (FIG. 1), turbine shrouds, such as shroud flanges 122 (FIG. 1), and other types of engine components.

The turbine component 200 may include an airfoil 202 with a generally concave pressure side 204 and a generally convex suction side 206 opposed thereto and joined at a leading edge 208 and a trailing edge 210. In a radial direction, the airfoil 202 extends from a tip 212 to a root 214, which is coupled to a platform 216 that defines an inner boundary for the hot combustion gases that pass over airfoil 202 during engine operation. The platform 216 may further include flow discouragers 218 and 220 that function to discourage hot gas ingestion into undesired areas. A mounting dovetail 222 may be integrally formed on the underside of the platform 216 for mounting the turbine component 200 within the turbine section 100 (FIG. 1). In some exemplary embodiments, the turbine component 200 may include internal passages or hollow areas to provide a cooling flow during engine operation, although in other embodiments, the turbine component 200 may be solid.

As described in greater detail below, the turbine component 200 may be considered with respect to one or more sections or portions 250, 270, and 290. In the illustrated embodiment, the portions 250, 270, and 290 may include a blade portion 250, a tip portion 270, and a hub portion 290. These specific portions are merely exemplary and used in the examples discussed below, although in other embodiments, other portions may be considered.

As described below, each portion 250, 270, and 290 may be optimized for a particular function. For example, the geometry of each portion 250, 270, and 290 is designed to achieve a designated function. Additionally, the material used to manufacture each portion 250, 270, and 290 may be selected to provide desired properties. As an example, the blade portion 250 of the turbine component 200 is typically subject to the highest temperatures, and as such, the material used to manufacture the blade portion 250 may be selected to optimize stress rupture properties in this area. Similarly, the material used to manufacture the tip portion 270 may be selected for oxidation and thermo-mechanical fatigue (TMF) resistance properties, which are particularly beneficial in this area of the turbine component 200. In general, the material used to manufacture the tip portion 270 may have a coefficient of thermal expansion that is lower than the material used to manufacture the blade portion 250. The material used to manufacture the attachment portion 290 may be selected for strength and fatigue resistance properties. Other considerations for material selection may include cost and yield, e.g., a high cost material may be desired to provide a particular property in one section that is not applicable to another section such that a low cost material may be substituted in the other section to provide a cost savings without sacrificing overall component performance or durability. In one exemplary embodiment, exemplary materials for the blade portion 250 include Honeywell's SC180, a single crystal nickel base superalloy, and Cannon Muskegon Corporation's CMSX486, a grain boundary strengthened nickel base superalloy. These exemplary materials for the blade portion 250 are intended to provide superior stress rupture and oxidation properties for the component. An exemplary material for the tip portion 270 includes Honeywell's HON-4A, a gamma prime hardened nickel base superalloy with solid solution strengtheners, as described in US20100008816A1, which is incorporated herein by reference. This alloy has a low coefficient of thermal expansion, which may result in less thermo-mechanical fatigue strain and improved creep resistance. This material may also provide superior oxidation and thermo-mechanical fatigue resistance for the component. Other materials for the tip portion 270 include other suitable high temperature capable nickel base superalloys that are predominately gamma prime hardened that have a reduced coefficient of thermal expansion and a high ductility for thermo-mechanical fatigue resistance. Exemplary materials for the attachment portion 290 include Honeywell's Alloy10, a third generation powder metal nickel base superalloy, which may provide superior strength and fatigue resistance.

Figure 3:
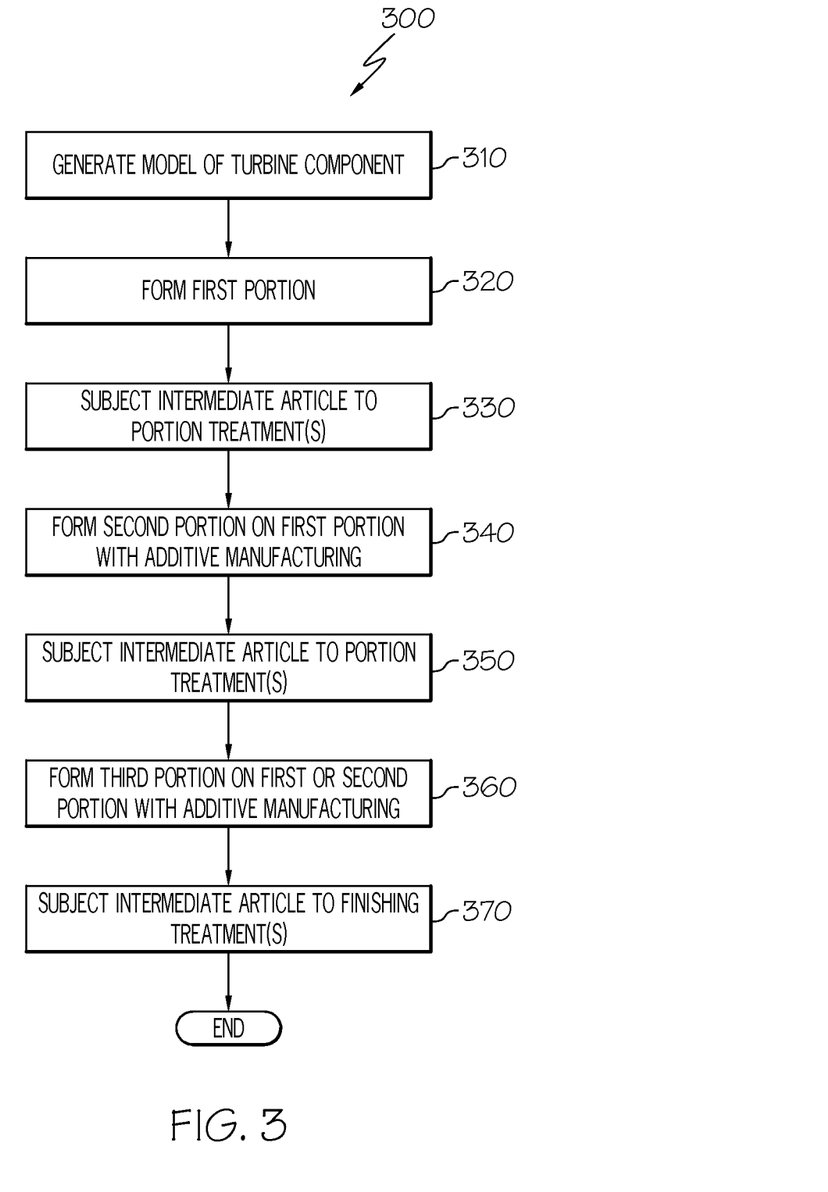
FIG. 3 is a flowchart of a method for manufacturing the turbine component of FIG. 2 in accordance with an exemplary embodiment.

FIG. 3 is a flowchart of a method 300 for manufacturing a turbine component, such as the turbine component 200 of FIG. 2, in accordance with an exemplary embodiment. Although method 300 refers to manufacturing turbine components, the method 300 may be suitable for manufacturing other components of an engine, including turbine stators, fan components, compressor components, combustor components, and/or other engine components. In a first step 310, a model, such as a design model, of the turbine component (e.g., component 200) may be defined in any suitable manner. Using the turbine component 200 of FIG. 2 as an example, the model may include the blade portion 250, the tip portion 270, and the attachment portion 290.

Returning to step 310 of the method 300, the model may be designed with computer aided design (CAD) software and include 3D numeric coordinates of the entire configuration of the turbine component 200 including both external and internal surfaces. In one exemplary embodiment, the model may include a number of successive 2D cross-sectional slices that together form the 3D component.

In step 320 of the method 300, a first portion of an intermediate turbine component article is formed according to the model of step 310. In the discussion of method 300, the unfinished turbine component at intermediate steps in the process, such as step 320, may be referred to as an intermediate turbine component article (or generally, "intermediate article"). In one exemplary embodiment, the blade portion 250 is the first portion formed in step 320, although the first portion may vary based on the considerations discussed below.

In one exemplary embodiment, the first portion is formed using a rapid prototyping or additive layer manufacturing process. Although additive layer manufacturing processes are described in greater detail below, in some embodiments, the first portion may be forged or cast in step 320, for example, with a single-crystal structure. In other embodiments, other manufacturing methods may be employed to fabricate the first portion.

Some examples of additive layer manufacturing processes include: micro-pen deposition in which liquid media is dispensed with precision at the pen tip and then cured; selective laser sintering in which a laser is used to sinter a powder media in precisely controlled locations; laser wire deposition in which a wire feedstock is melted by a laser and then deposited and solidified in precise locations to build the product; electron beam melting; laser engineered net shaping; and direct metal deposition. In general, additive manufacturing techniques may provide flexibility in free-form fabrication without geometric constraints, fast material processing time, and innovative joining techniques. In one particular exemplary embodiment, direct metal laser fusion (DMLF) is used to produce the first portion of step 320. DMLF is a commercially available laser-based rapid prototyping and tooling process by which complex parts may be directly produced by precision melting and solidification of metal powder into successive layers of larger structures, each layer corresponding to a cross-sectional layer of the 3D component. DMLF may include direct metal laser sintering (DMLS).

As such, in one exemplary embodiment, step 320 is performed with DMLF techniques to form the first portion (e.g., blade portion 250) of the turbine component. However, prior to a discussion of the subsequent method steps, reference is made to FIG. 4, which is a schematic view of a DMLF system 400 for manufacturing the one or more portions of the turbine component 200 of FIG. 2 in accordance with an exemplary embodiment.

Figure 4:
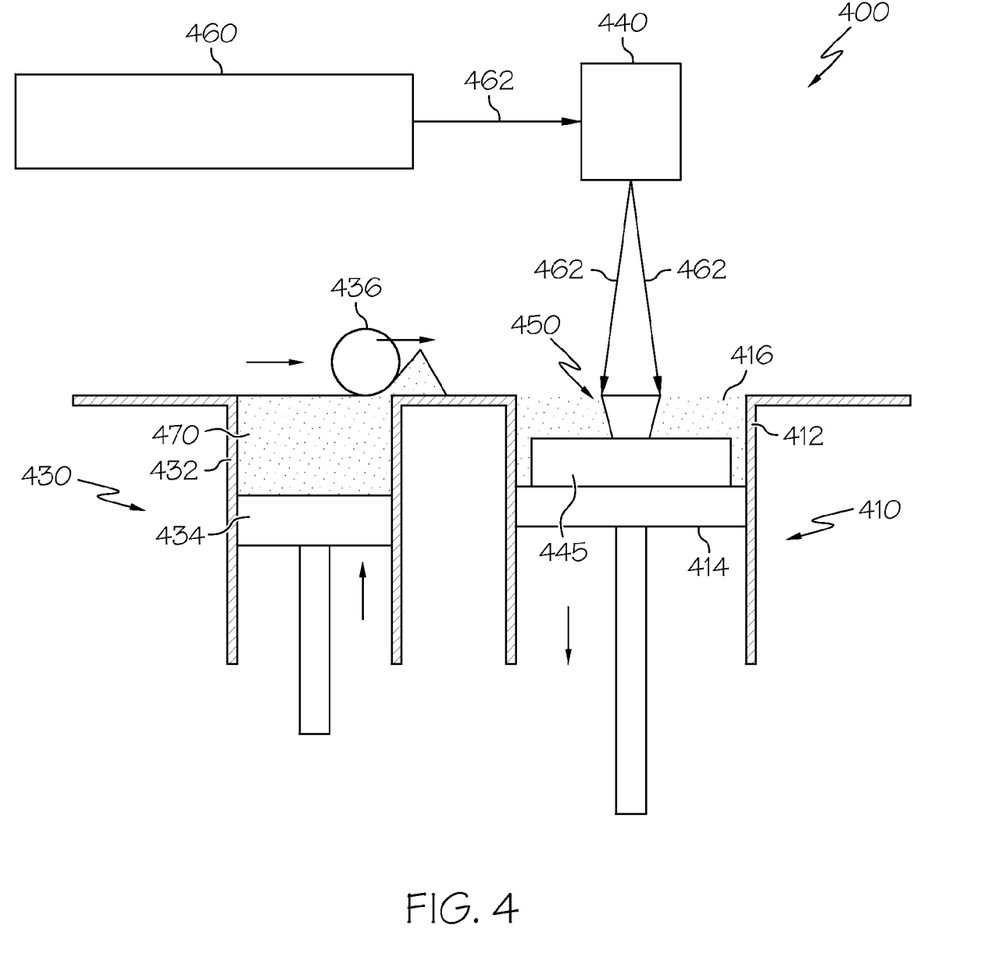
FIG. 4 is a schematic view of a system used in manufacturing the turbine component of FIG. 2 according to the method of FIG. 3 in accordance with an exemplary embodiment.

Referring to FIG. 4, the system 400 includes a fabrication device 410, a powder delivery device 430, a scanner 440, and a laser 460 that function to manufacture the respective portion of an intermediate turbine component article 450 with build material 470. As noted above, in this exemplary embodiment, the first portion formed in step 320 is the blade portion.

The fabrication device 410 includes a build container 412 with a fabrication support 414 on which the intermediate turbine component article 450 is formed and supported. The fabrication support 414 is movable within the build container 412 in a vertical direction and is adjusted in such a way to define a working plane 416. The delivery device 430 includes a powder chamber 432 with a delivery support 434 that supports the build material 470 and is also movable in the vertical direction. The delivery device 430 further includes a roller or wiper 436 that transfers build material 470 from the delivery device 430 to the fabrication device 410.

During operation, a base block 445 may be installed on the fabrication support 414. The fabrication support 414 is lowered and the delivery support 434 is raised. The roller or wiper 436 scrapes or otherwise pushes a portion of the build material 470 from the delivery device 430 to form the working plane 416 in the fabrication device 410. The laser 460 emits a laser beam 462, which is directed by the scanner 440 onto the build material 470 in the working plane 416 to selectively fuse the build material 470 into a cross-sectional layer of the intermediate turbine component article 450 according to the design. More specifically, the speed, position, and other operating parameters of the laser beam 462 are controlled to selectively fuse the powder of the build material 470 into larger structures by rapidly melting the powder particles that may melt or diffuse into the solid structure below, and subsequently, cool and resolidify. As such, based on the control of the laser beam 462, each layer of build material 470 will include unfused and fused build material 470 that respectively corresponds to the cross-sectional passages and walls that form the intermediate turbine component article 450. In general, the laser beam 462 is relatively low power to selectively fuse the individual layer of build material 470. As an example, the laser beam 462 may have a power of approximately 50 to 500 Watts, although any suitable power may be provided.

Upon completion of a respective layer, the fabrication support 414 is lowered and the delivery support 434 is raised. Typically, the fabrication support 414, and thus the intermediate turbine component article 450, does not move in a horizontal plane during this step. The roller or wiper 436 again pushes a portion of the build material 470 from the delivery device 430 to form an additional layer of build material 470 on the working plane 416 of the fabrication device 410. The laser beam 462 is movably supported relative to the intermediate turbine component article 450 and is again controlled to selectively form another cross-sectional layer. As such, the intermediate turbine component article 450 is positioned in a bed of build material 470 as the successive layers are formed such that the unfused and fused material supports subsequent layers. This process is continued according to the modeled design as successive cross-sectional layers are formed into the completed desired portion, e.g., the first portion of step 320.

The delivery of build material 470 and movement of the intermediate turbine component article 450 in the vertical direction are relatively constant and only the movement of the laser beam 462 must be selectively controlled to provide a simpler and more precise implementation. The localized fusing of the build material 470 enables more precise placement of fused material to reduce or eliminate the occurrence of over-deposition of material and excessive energy or heat, which may otherwise result in cracking or distortion. The unused and unfused build material 470 may be reused, thereby further reducing scrap.

Any suitable laser and laser parameters may be used, including considerations with respect to power, laser beam spot size, and scanning velocity. As a general matter, the build material 470 may be formed by any suitable powder, including powdered metals, such as a stainless steel powder, and alloys and super alloy materials, such as nickel-based or cobalt superalloys. In one exemplary embodiment, the build material 470 is a high temperature nickel base super alloy such as MAR-M-247, SC180, CMSX486, HON-4A, and Alloy10. In other embodiments, IN718 or IN738 or other suitable alloys may be employed. In general, the powder build material 470 may be selected for enhanced strength, durability, and useful life, particularly at high temperatures, although as described below, the powder build material 470 may also be selected based on the intended function of the area being formed. Each successive layer may be, for example, between 10 μm and 200 μm, although the thickness may be selected based on any number of parameters.

As noted above, the build material 470 may be selected based on the desired properties of the portion respectively being formed. For example, in step 320, if the first portion being formed is the blade portion 250, the build material 470 may be selected for stress rupture resistance properties, for example, SC180 and CMSX486.

Returning to FIG. 3, at the completion of step 320, the first portion is removed from additive manufacturing system (e.g., from the DMLF system 400). In optional step 330, the first portion formed in step 320 may undergo portion treatments. In some embodiments, the method 300 may proceed directly to step 340 and the portion treatments of step 330 may be omitted and/or incorporated into subsequent steps.

Generally, the portion treatments of step 330 refer to intermediate processing treatments that may be suitable for the first portion but that may be unsuitable for portions formed in subsequent steps, e.g., because of the temperature or other processing requirements of the desired treatment. In step 330, portion treatments may include, for example, solutioning, aging, annealing, quenching, peening, polishing, hot isostatic pressing (HIP), or coatings. For example, in one embodiment the first portion may comprise a blade airfoil portion 250 fabricated from CMSX486. Portion treatments of step 330 may comprise stress relief, solutioning, high temperature aging, peening, HIP, and polishing. In other embodiments, an alternate material or fabrication method may be employed which may result in different step 330 portion treatments for optimizing the component. One example of a post-laser fusion process of step 330 is a HIP process in which an encapsulation layer is applied to the intermediate turbine component article and pressure and heat are applied to remove or reduce any porosity and cracks internal to or on the surface. The encapsulation layer functions to effectively convert any surface porosity and cracks into internal porosity and cracks, and after the application of pressure and heat, removes or reduces the porosity and cracks. Such encapsulation layers may be subsequently removed or maintained to function as an oxidation protection layer. In one exemplary embodiment, the encapsulation layer may be a metal or alloy that is compatible with the substrate and may be applied by a plating or coating process, as described below. In one embodiment, the HIP process may be performed at a processing temperature in a range of about 1000° C. to about 1300° C. and may be performed at a pressure in a range of about 1 ksi to about 25 ksi for a time period of about 1 to about 10 hours. In other embodiments, the HIP processing temperature, pressure, and time may be smaller or larger to form a compacted solid having negligible porosity.

Upon completion of step 330, the method 300 proceeds to step 340 in which a second portion is formed on the first portion. In one exemplary embodiment, the second portion may be formed by additive manufacturing techniques discussed above in reference to step 320. As such, the intermediate turbine article 300 may be positioned within the DMLF system 400 described above and iterative layers of the second portion may be formed by depositing a build material 470 initially on the first portion and subsequently on the underlying layers of the second portion and selectively fusing the deposited material to form the second portion according to the model generated in step 310. The use of additive manufacturing to form a second portion on the first portion may be superior to the conventional bonding techniques, such as brazing and diffusion bonding with braze foils, since the additive manufacturing does not require the introduction of extraneous materials such as melting point suppressing elements like boron, silicon, or phosphorous which contaminate and complicate the metallography of the structural interface of the first portion to the second portion.

In one exemplary embodiment, the second portion is the tip portion 270 that is built on the blade portion 250. Since the tip portion 270 is formed in separate steps from the blade portion 250, the build material 470 of step 340 may be different from the build material 470 of step 320. For example, in step 340, the build material 470 for the tip portion 270 may be selected for oxidation and TMF resistance properties, for example, using HON4A. The additive manufacturing technique of step 340 enables the second portion to be formed directly on the first portion with a different, optimized build material 470 such that the resulting structure, discussed below, may have portion-specific properties.

At the completion of step 340, the intermediate turbine article, which now includes the first and second portions, is removed from additive manufacturing system (e.g., from the DMLF system 400). In optional step 350, the intermediate turbine article may undergo additional portion treatments. In some embodiments, the method 300 may proceed directly to step 360 and the portion treatments of step 350 may be omitted and/or incorporated into subsequent steps. Generally, as in step 330, the portion treatments of step 350 refer to treatments that may be suitable for the first and second portions but that may be unsuitable for portions formed in subsequent steps. Such treatments may include, for example, aging, annealing, quenching, peening, polishing, hot isostatic pressing (HIP), or coatings.

Upon completion of step 350, the method 300 proceeds to step 360 in which a third portion is formed on the first and/or second portion. In one exemplary embodiment, the third portion may be formed by additive manufacturing techniques discussed above in reference to step 320. As such, the intermediate turbine article, which initially includes the first and second portions, is positioned within the DMLF system 400 described above and iterative layers of the third portion may be formed by depositing a build material 470 initially on the first or second portion and subsequently on the underlying layers of the third portion and selectively fusing the deposited build material to form the third portion according to the model generated in step 310.

In one exemplary embodiment, the third portion is the attachment portion 290 that is built on the blade portion 250. Since the attachment portion 290 is formed in separate steps from the blade portion 250 and the tip portion 270, the build material 470 of step 360 may be different from the build material 470 of step 320 or step 340. As an example, in step 360, the build material 470 for the attachment portion 290 may be selected for strength and fatigue resistance properties, such as Alloy10. In some embodiments, step 360 may be omitted and the turbine component may only include two portions. Moreover, although not shown, the turbine component may include more than three portions and step 360 may be repeated with additional portions.

At the completion of step 360, the intermediate turbine article, which now includes the first, second, and third portions, is removed from the additive manufacturing system (e.g., from the DMLF system 400). In optional step 370, the intermediate turbine article may undergo finishing treatments. Such treatments may include, for example, aging, annealing, quenching, peening, polishing, hot isostatic pressing (HIP), or coatings.

If necessary, the intermediate turbine article may be machined to the final specifications to form the turbine component 200. The machining techniques may include, for example, the addition of a tip cap, machining of the dovetail, formation of cooling holes, and grinding the rotor tips. In other embodiments, the intermediate turbine article may undergo optional coating operations such as oxidation, environmental, and thermal barrier coatings. At this point, the intermediate turbine component article corresponds to the completed turbine component 200 shown in FIG. 2. In further steps (not shown), the turbine component 200 may be tested and installed in a turbine section of a gas turbine engine, as shown in FIG. 1.

Although FIG. 3 is discussed with respect to a rotor turbine component 200, in other embodiments, different types of components may be fabricated with method 300. For example, a turbine stator may include a single crystal nickel base superalloy airfoil with the primary and secondary crystallographic orientations oriented for optimal creep and thermo-mechanical fatigue resistance. The airfoil may be attached to an inner flow path hub made of a less expensive but high strength material such as Mar-M-247, and the airfoil may be attached to an outer flow path shroud made of Mar-M-247. In other embodiments, other combinations of materials and crystallographic orientations may be employed to obtain an optimal component for the particular application.

Accordingly, the method 300 forms the turbine component 200 from more than one material, particularly materials selected for optimal functional properties. The method 300 is described above with respect to exemplary embodiments. However, in one particular exemplary embodiment, step 310 of method 300 includes creating a 3D solid design model of a multi-material turbine blade. Step 320 may include forming first portion blade airfoil portion 250 from a cast SC180 single crystal nickel base superalloy that is crystallographically aligned to optimize stress rupture and thermo-mechanical fatigue properties. In this particular embodiment, the optional portion treatments of step 330 may include solutioning, HIP, and aging processing to enhance stress rupture and fatigue properties. Step 340 may include the forming of a second portion turbine blade tip 270 from a nickel base superalloy HON-4A using DMLF additive manufacturing processes. In this embodiment example, optional processing portion treatment step 350 may include stress relief processing to eliminate thermal build stresses from the DMLF processing, peening of the blade tip 270 to reduce surface roughness, encapsulation and HIP to enhance metallography in the blade tip 270, and optional high temperature aging processing for optimal microstructure. Step 360 in this embodiment example may include utilizing DMLF additive manufacturing methods to form a third hub portion 290 from a nickel base superalloy Alloy10 for superior strength and fatigue resistance in the blade dovetail region of the component. Step 370 may include stress relief processing to eliminate thermal build stresses from the DMLF processing, peening of the blade hub 290 to reduce surface roughness, encapsulation and HIP to enhance metallography in the blade hub 290, and potential thermal aging processing for optimal microstructure. Additional finishing treatment 370 may include machining the blade dovetail 222, machining the blade tip 212, final age heat treatments to the final component, oxidation and thermal barrier coatings, shot peening of the dovetail to induce compressive surface stresses for enhanced fatigue life, and other machining to satisfy the design requirements of the 3D solid design model of the component generated in step 310.

The method 300 has been discussed above with reference to the formation of a single intermediate turbine article, and thus, a single turbine component. However, in one exemplary embodiment of the method 300, more than one intermediate turbine article may be manufactured simultaneously. Unless otherwise noted, method 300 in this embodiment proceeds as discussed above. In this embodiment of the method 300, the intermediate turbine articles are formed on a common base block (e.g., base block 445) to provide a common orientation and a known point of reference and formed as discussed above. Successive layers can be formed for the group of intermediate turbine articles simultaneously according to a common module or design. For example, the powdered metal may be deposited across a single working plane and one or more lasers may selectively fuse the layers of each intermediate turbine article, either sequentially or simultaneously. The intermediate turbine articles may then be lowered together for the formation of the next layer. Simultaneous fabrication of a number of components may minimize cost and variability of the manufacturing process.

Accordingly, exemplary embodiments may enhance turbine components fabricated with additive manufacturing techniques, including DMLF. In particular, durability and life span of the turbine component may be improved by manufacturing each portion of the turbine component with the optimal material. Additionally, rapid prototyping with additive manufacturing reduces costs and cycle time in the engine design, particularly in the iterative environment of engine design. Additionally, exemplary embodiments may produce turbine components capable of withstanding higher temperatures and stresses, thereby leading to further improvements in engine performance. Exemplary embodiments are applicable to both commercial and military gas turbine engines and auxiliary power units, including industrial applications such as electricity generation, naval propulsion, pumping sets for gas and oil transmission, aircraft and/or spacecraft propulsion, automobile engines, and/or stationary power plants.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. Various changes may be made in the function and arrangement of elements described in an exemplary embodiment without departing from the scope of the invention as set forth in the appended claims.

What is claimed is:

1. A method for manufacturing an engine component, comprising the steps of:
   providing a blade portion of an intermediate component article, the blade portion comprising a first material;
   subjecting the blade portion of the intermediate component article to a heat treatment unsuitable for the second material
   forming, after the subjecting step, an attachment portion of the intermediate component article on the blade portion of the intermediate component article with an additive manufacturing technique, the attachment portion comprising a second material; and
   finishing the intermediate component article to form the engine component.

2. The method of claim 1, wherein the forming step includes direct metal laser fusing sequential layers of build material into the attachment portion.

3. The method of claim 1, wherein forming step includes forming the attachment portion with direct metal laser fusion.

4. The method of claim 1, wherein providing step includes providing the blade portion such that the first material is a single crystal material.

5. The method of claim 1, wherein the forming step includes forming the attachment portion such that the second material is a powder metal nickel base superalloy.

6. The method of claim 1, wherein the providing step includes direct metal laser fusing sequential layers of build material into the blade portion, and wherein the subjecting step includes subjecting the blade portion to a hot isostatic pressing (HIP) process prior to the forming of the attachment portion.

7. A method for manufacturing an engine component, comprising the steps of:
   providing a blade portion of an intermediate component article, the blade portion comprising a first material;
   forming an attachment portion of the intermediate component article on the blade portion of the intermediate component article with an additive manufacturing technique, the attachment portion comprising a second material;
   forming a tip portion of the intermediate component article on the blade portion of the intermediate component article, the tip portion comprising a third material; and finishing the intermediate component article to form the engine component.

8. The method of claim 7, wherein the step of forming the tip portion includes forming the tip portion such that the third material is at least one of HON4A or a high temperature nickel base superalloy that is predominately gamma prime hardened.

9. The method of claim 7, wherein the first, second, and third materials are different materials.

10. A method for manufacturing an engine component, comprising the steps of:
  providing a first portion of an intermediate component article, the first portion comprising a first material;
  forming a second portion of the intermediate component article on the first portion of the intermediate component article with an additive manufacturing technique, the second portion comprising a second material; and
  forming a third portion of the intermediate component article on the first portion of the intermediate component article, the third portion comprising a third material,
  wherein the engine component is a turbine component, and wherein the providing step includes providing a blade portion as the first portion, the forming the second portion includes providing a tip portion as the second portion, and the forming the third portion includes providing an attachment portion as the third portion;
  subjecting first and second portions of the intermediate component article to a heat treatment prior to the step of forming the third portion of the intermediate component article; and
  finishing the intermediate component article to form the engine component.

* * * * *